United States Patent [19]

Kumar et al.

[11] Patent Number: 5,513,363
[45] Date of Patent: Apr. 30, 1996

[54] SCALABLE REGISTER FILE ORGANIZATION FOR A COMPUTER ARCHITECTURE HAVING MULTIPLE FUNCTIONAL UNITS OR A LARGE REGISTER FILE

[75] Inventors: Rajendra Kumar, Sunnyvale; Paul G. Emerson, San Jose, both of Calif.

[73] Assignee: Hewlett-Packard Company, Palo Alto, Calif.

[21] Appl. No.: 293,862

[22] Filed: Aug. 22, 1994

[51] Int. Cl.$^6$ ........................................ G06F 9/00
[52] U.S. Cl. .................... 395/800; 395/375; 395/496; 395/405; 364/DIG. 1; 364/228.7; 364/231.8; 364/247; 364/263.1
[58] Field of Search ................................ 395/800, 375, 395/405, 497.04, 494, 496

[56] References Cited

U.S. PATENT DOCUMENTS

| | | | |
|---|---|---|---|
| 4,323,965 | 1/1980 | Johnson et al. | 395/484 |
| 5,299,321 | 3/1994 | Iizuka | 395/375 |
| 5,333,280 | 4/1994 | Ishikawa et al. | 395/375 |
| 5,335,333 | 8/1994 | Hinton et al. | 395/417 |
| 5,440,714 | 8/1995 | Wang | 395/492 |

OTHER PUBLICATIONS

Su et al. "A Software Pipelining Based VLIW Architecture and Optimized Compiler" IEEE, 1990.
Ugurdag et al. "A VLIW Architecture Based on Shifting Register Files" IEE 1993.

Primary Examiner—Alyssa H. Bowler
Assistant Examiner—L. Donaghue

[57] ABSTRACT

A scalable register file including first and second micro-register files organized in a pipelined fashion to minimize the access time of the register file where there are a large number of registers or multiple functional units. Interposed between the first and second micro-register files are a first plurality of pipeline registers for storing the register contents fetched from the first micro-register file during a first pipeline cycle. A second plurality of pipeline registers are coupled to the second micro-register files for storing the register contents fetched from the second micro-register file during a second pipeline stage and those registers being stored in the first plurality of pipeline registers. The first plurality of pipeline registers are coupled to the bit lines of the second micro-register file. Enable logic is coupled to each of the first plurality pipeline registers to selectively present the contents of the first plurality of pipeline register to the second plurality of pipeline registers if there were contents stored in a first pipeline register during the first pipeline cycle. Alternatively, a multiplexer can be used to present the register contents stored in the first plurality of pipeline registers to the second plurality of pipeline registers.

22 Claims, 4 Drawing Sheets

SCALABLE REGISTER FILE ORGANIZATION FOR A COMPUTER ARCHITECTURE HAVING MULTIPLE FUNCTIONAL UNITS OR A LARGE REGISTER FILE

BACKGROUND OF THE INVENTION

This invention relates generally to computer organization and more particularly to register file organization in a computer architecture having a large number of registers or multiple functional units.

A typical multiported register file 10 is shown in FIG. 1. The register file 10 includes N registers each having M read ports and at least one write port. Coupled to the register file 10 are instruction decoders 12 which decode instructions held in a number L of instruction registers 14. Typically there are two read ports for each instruction register, i.e., M=2×L, to allow both source operands to be fetched simultaneously. The plurality of registers 14 include L registers, with each register being associated with a corresponding functional unit (not shown). This organization is typical for a superscalar architecture or a very long word instruction word (VLIW) architecture, wherein each instruction register 14 is associated with a corresponding functional unit. The decoders 12 decode the register fields of the instruction registers 14 and select the corresponding register in the register file 10. Also coupled to the register file 10 are a plurality of registers 16. Each of the registers 16 is coupled to a respective one of the output ports or read ports of the register file 10.

A detailed schematic of an individual register cell 18 of the register file 10 is shown in FIG. 2. The cell 18 includes two inverters I1 and I2 connected in a circular fashion to form the basis of the register cell. The register cell of FIG. 2 includes two read ports (P1 and P2) and a single write port (W). The write port includes pass transistor 20 connected between a write bit line Bit Line W and an input of the register cell. The first read port includes transistors 22 and 26 and the second read port includes transistors 24 and 25, each port being connected in a conventional manner, as is known in the art. It is apparent that with the addition of each read port the size of the register cell increases. This increased size of the register cell increases the access time of the overall register file due to the increase in capacitance and resistance of the individual cells. This problem is exacerbated if the number of registers in the register file is relatively large as well because of the increased capacitance and resistance of the bit lines in the register file. In fact, it can be shown that the access time is a quadratic function of the number of functional units and the number of registers.

Simulations of the register file of FIGS. 1 and 2 demonstrate the relationship of the access time of the register file as a function of the number of functional units and the number of registers in the register file. The results of these simulations are shown in FIG. 3. In FIG. 3, the access time of the register file Taccess is plotted as a function of the number of functional units for a number of different sized register files. The access time as a function of the number of functional units for register files having 32, 64, 128, 192 and 256 is shown in plots 32, 34, 36, 38 and 40, respectively, in FIG. 3.

Although the access time of the register file (Taccess) is typically not the critical path of the microprocessor, as the number of functional units and/or number of registers increases, the access time of the register file can become the critical path of the microprocessor. For example, assuming a critical path of two nanoseconds, for a register file having 128 registers, a computer architecture having over four functional units will result in the register file becoming the critical path in the computer. This relationship is shown in plot 36 of FIG. 3. Although current superscalar architectures typically do not require more than four functional units, VLIW architectures are capable of supporting significantly more functional units than four. As a result, the access time the register file in VLIW architectures can be a significant obstacle to achieving very fast cycle times.

Accordingly, a need remains for a low access time register file for a computer architecture having multiple functional units.

SUMMARY OF THE INVENTION

It is, therefore, an object of the invention to provide a low access time register file for a computer architecture having multiple functional units.

The register file according to the invention includes two or more micro-register files arranged in a pipeline fashion so that each micro-register file is accessed only during a corresponding pipeline cycle. Each micro-register file contains a subset of the register files. By partitioning the register file into two or more micro-register files, the access time of the individual micro-register files is substantially less than the access time of an unpartitioned register file. A pipeline register for each register file port is interposed between the micro-register files to temporarily store the contents of the registers accessed from the corresponding micro-register files. These pipeline registers can be coupled to the bit lines of the subsequent micro-register file and thereby minimize the amount of additional wiring required to support the partitioned register file. If the pipeline registers are coupled directly to the bit lines of the subsequent micro-register file, the pipeline registers for each of the pipeline register stages, except for the last, are tristatable. Enable logic included with each register stage enables the tristate registers in order to drive their contents onto the bit lines of the subsequent micro-register file under certain circumstances described hereinbelow.

An advantage of the present invention is that the scalable register file organization can work with any computer architecture, even those having only a single functional unit.

The foregoing and other objects, features and advantages of the invention will become more readily apparent from the following detailed description of a preferred embodiment of the invention which proceeds with reference to the accompanying drawings.

DETAILED DESCRIPTION

Figure 4:
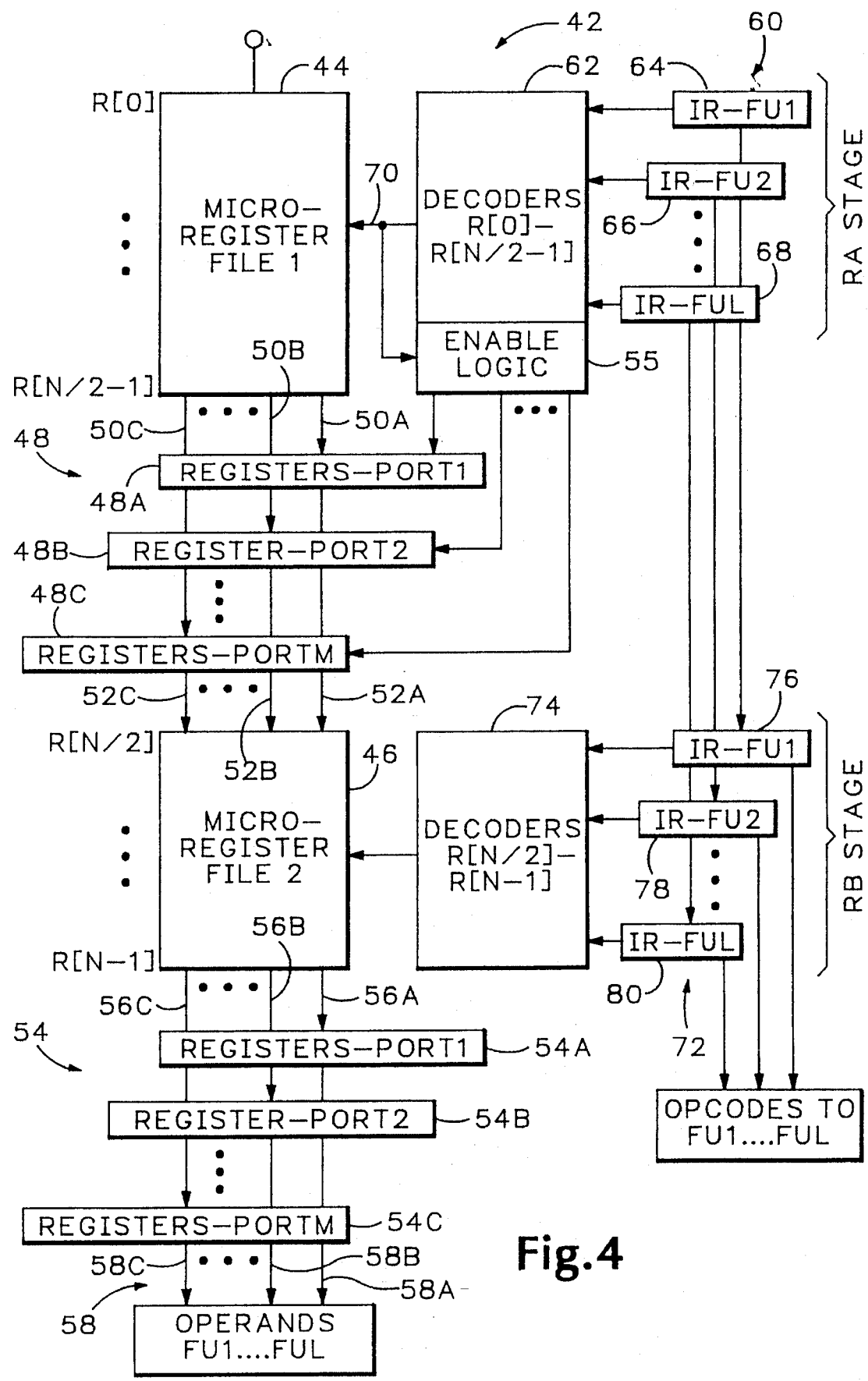
FIG. 4 is a block diagram of a scalable register file organization according to the invention.

Referring now to FIG. 4, a scalable register file organization 42 according to the invention is shown. The register file organization includes two micro-register files 44 (File 1) and 46 (File 2) organized in a pipeline fashion. Micro-register file 44 includes a subset of the registers of the register file. This subset includes registers R[0]–R[N/2-1]. The second micro-register file 46 includes another subset of the register file, i.e., R[N/2]–R[N-1]. It can be seen that micro-register files 44 and 46 comprise contiguous portions of the register file. In the event that more than two partitions were used, each of the micro-register files would have an equal number of registers in a similar manner.

Interposed between micro-register file 44 and micro-register file 46 is a first plurality of pipeline registers 48. The pipeline registers 48 include a plurality M of registers, with each pipeline register being coupled to a corresponding output port or read port of the micro-register file 44. Only the read ports are shown for simplicity but the inventive principle extends equally as well to the write ports of the micro-register files.

Each of the plurality of pipeline registers is labeled with a unique lettered suffix, e.g., 48A, 48B, and 48C. A bus is connected between each pipeline register and the corresponding read port of the micro-register file 44. The reference numerals for the buses retain the same lettered suffix as the corresponding pipeline register. For example, bus 50A is connected between the pipeline register 48A and a corresponding read port of the micro-register file 44. Similarly, buses 50B and 50C are connected to registers 48B and 48C, respectively. Buses 50A–50C are connected to the data input terminals of the respective registers.

The pipeline registers 48A, 48B, 48C are coupled to the micro-register file 46 through buses 52A, 52B, 52C, respectively. The buses 52A–52C are connected between the data out terminals of the pipeline registers and the bit lines of a corresponding port in the micro-register file 46. In order to avoid contention between the pipeline registers 48 and the register cells of the micro-register file 46, the registers 48 include tristatable output drivers which are selectively enabled by enable logic 55, described further below. The registers 48 can be coupled directly to the bit lines of the micro-register file 46 because we can be assured that if a register is found in the micro-register file 44 it will not be needed from micro-register file 46. This assurance comes from the mutual exclusivity of the two micro-register files. The mutual exclusivity follows from partitioning the register file into non-overlapping, mutually exclusive subsets of registers.

The micro-register file 46 similarly includes a second plurality of pipeline registers 54 (registers 54A, 54B, 54C) coupled in a substantially identical manner to micro-register file 46 as registers 48 are coupled to micro-register file 44. A plurality of buses 56 (56A, 56B, 56C) couple the second micro-register file to the second plurality of pipeline registers 54. In the event that the register file is partitioned into additional micro-register files, an additional plurality of pipeline registers are required for each additional micro-register file, as would be apparent to one skilled in the art.

Figure 1:
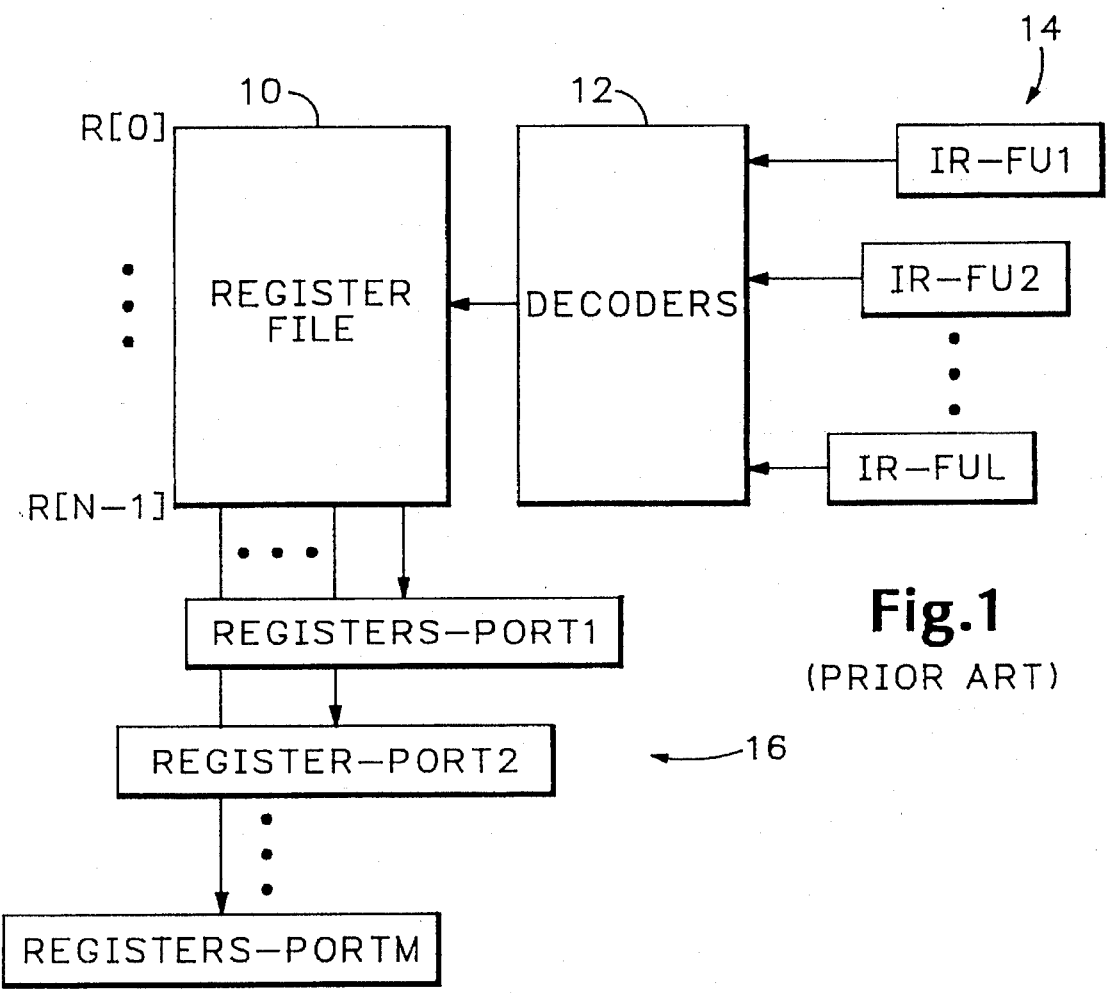
FIG. 1 is a block diagram of a prior art register file organization.
Figure 5:
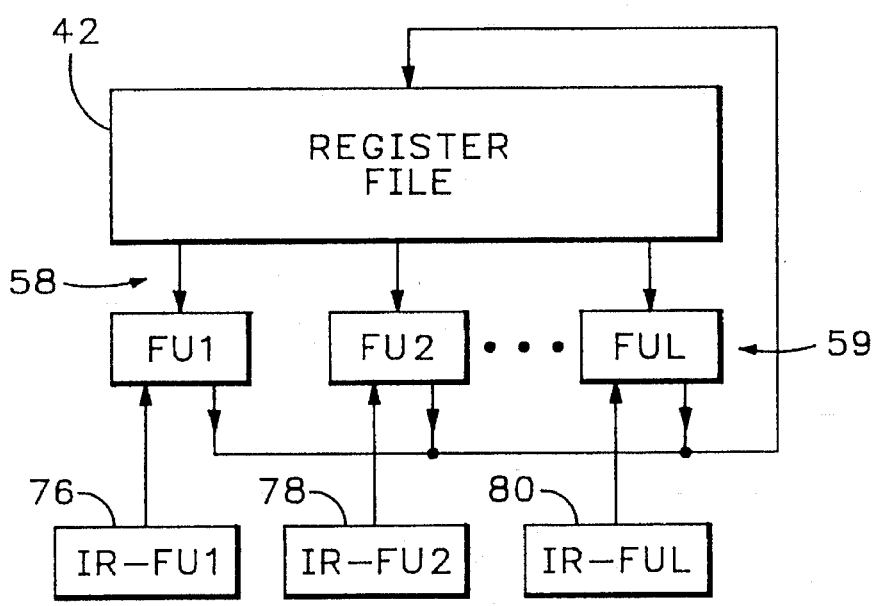
FIG. 5 is a simplified block diagram of a microprocessor including the scalable register file of FIG. 4 and multiple functional units.
Figure 2:
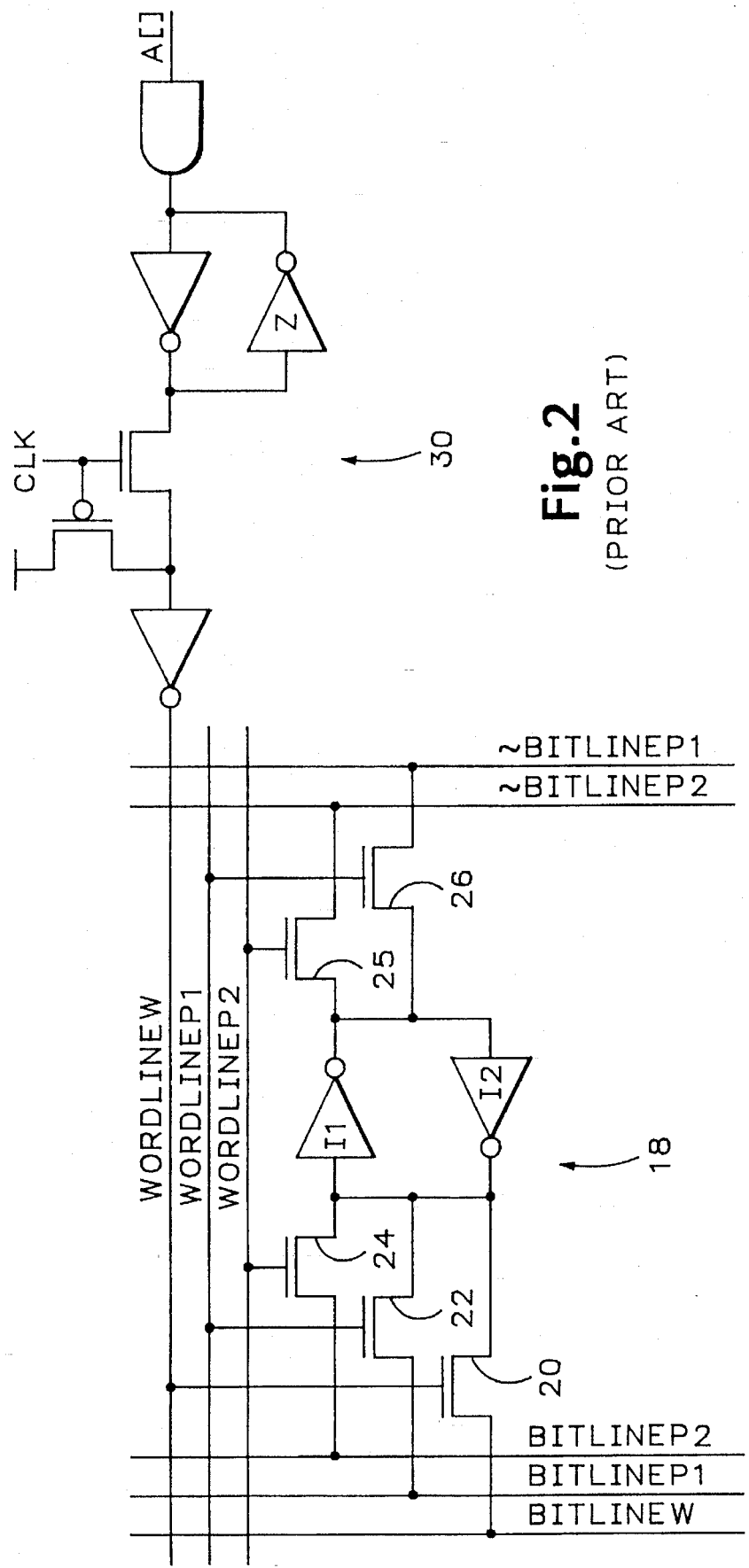
FIG. 2 is a schematic drawing of a register cell of the register file of FIG. 1.
Figure 3:
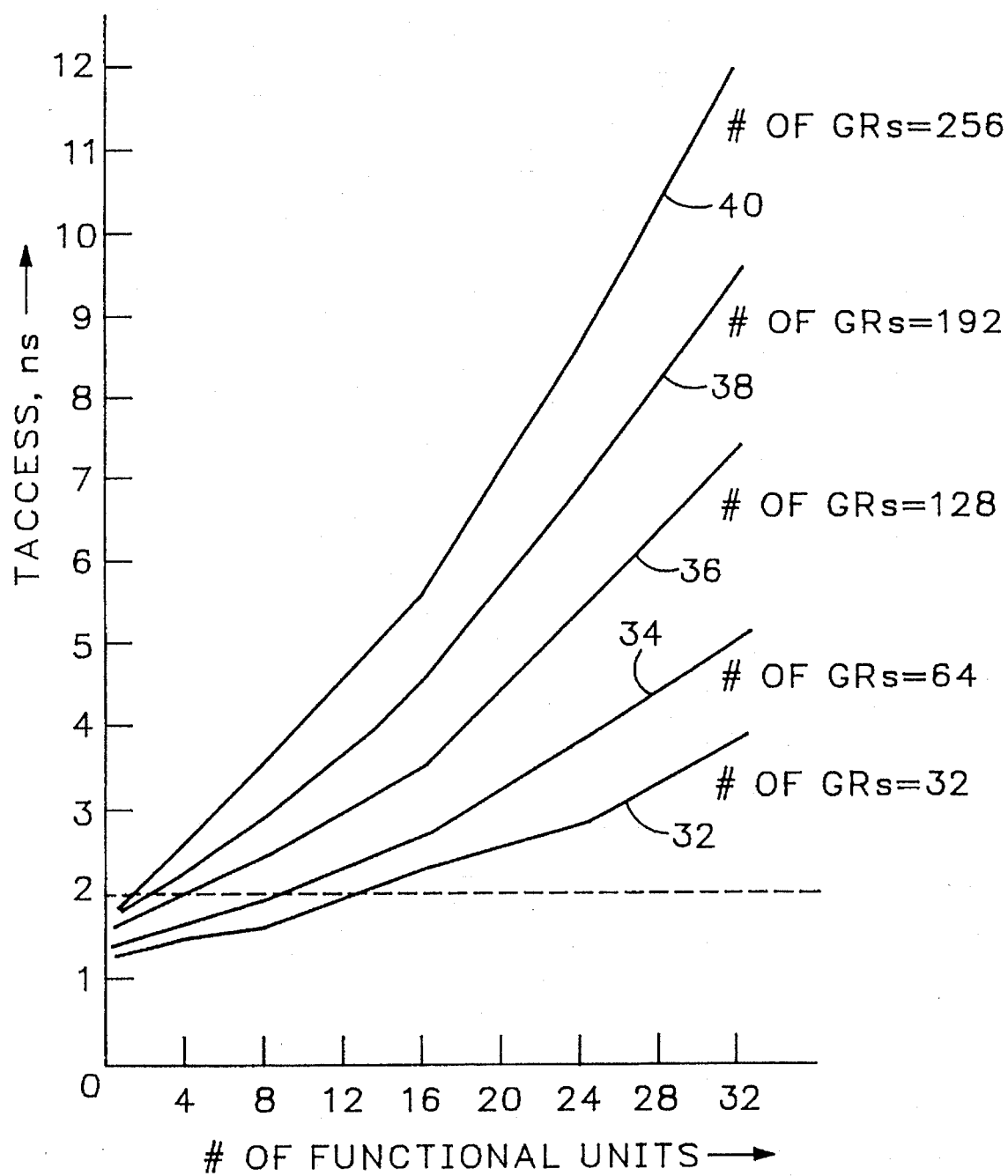
FIG. 3 is a plot of the access time of the register file organization of FIG. 1 as a function of the number of functional units for various sized register files.

A register output bus 58 (buses 58A, 58B, 58C) couples the register file 42 to functional units 59 (FU1, FU2, . . . FUL), as shown in FIG. 5. The register output bus 58 couples the register file ports to the associated functional units 59.

Associated with each micro-register file is a plurality of instruction registers and a instruction decoder. Associated with the micro-register file 44 is a first plurality of instruction registers 60 and an instruction decoder 62 for decoding the contents thereof. The first plurality of instruction registers 60 include L number of instruction registers (instruction registers 64, 66, 68), with each instruction register associated with a corresponding functional unit, as shown in FIG. 5. The instruction registers each hold an instruction corresponding to the associated functional unit. The instruction contains register fields which specify the desired source and destination operands required by the associated functional unit. The instruction decoder 62 decodes these register fields and enables the word lines of the micro-register file 44 over bus 70 coupled between the instruction decoder 62 and the micro-register file 44. Each of the ports of the micro-register file 44 is associated with a respective one of the functional units. In a typical RISC architecture, each functional unit will have assigned thereto two read ports and one write port. In some higher performance implementation, however, there may be multiple write ports, with each write port being assigned to a respective functional unit. The inventive principle taught herein applies equally well to implementations having multiple write ports.

The instruction decoder 62 is a combinatorial logic network that decodes the register fields of the instruction registers 60. The design of instruction decoders is well known in the art. The instruction decoder 62 is responsible for selecting only those registers included in the corresponding micro-register file 44. In the example shown in FIG. 4, the decoder 62 is responsible for selecting or decoding only registers R[0]–R[ N/2-1]. For this, using two micro-register files, the decoder 62 can simply decode the most significant bit of the register fields to determine whether the desired registers reside within the micro-register file 44. If additional partitions are used, additional bits of the register fields would need to be decoded.

Associated with the micro-register file 46 is a second plurality of instruction registers 72 and a second instruction decoder 74. Each of the second plurality of instruction registers is coupled to a respective one of the first plurality of instruction registers 60 for receiving the instruction held therein. For example, the instruction register 76, associated with a first functional unit FU1, is coupled to the instruction register 64, also associated with functional unit FU1. If additional partitions are used, an additional plurality of instruction registers and instruction decoder are needed for each additional partition.

The instruction decoder 74 is responsible for decoding or selecting the registers which reside in the micro-register file 46, i.e., R[N/2]–R[N-1]. As with micro-register file 44, the ports of the micro-register file 46 are associated with a respective one of the functional units. The decoder 74 is aware of which ports are associated with which functional units and selects the appropriate registers as specified by the corresponding instruction register. For example, registers 54A and 54B could be associated with functional unit FU1 and the decoder 74 would then select the registers as specified by the instruction register 76 and place the contents of those selected registers on buses 56A and 56B.

As indicated above, associated with the first plurality of pipeline registers 48 is enable logic 55. The enable logic 55 enables the tristate drivers of the pipeline registers 48 in the event that a register was selected from the micro-register file 44 during a first pipeline cycle and stored therein. The enable logic 55 enables the register in order to drive the contents thereof onto the bit lines of the corresponding port of the micro-register file 46 during a second pipeline cycle, subsequent to the first pipeline cycle. The contents driven out onto the bit lines are then latched in the pipeline register 54 corresponding to the same port, i.e., one of registers 54A, 54B, 54C. The enable logic 55 takes as its input the output of the instruction decoder 62, which indicates which, if any, of the registers in the micro-register file 44 were accessed during the first pipeline cycle. If any of the registers in the micro-register file 44 were accessed, the enable logic 55 will enable the registers 48 in which those micro-register file register contents were stored. The registers 48 are enable during the second pipeline cycle. The mutual exclusivity of the micro-register files 44 and 46 ensures that there will be no contention for the bit lines in the micro-register file 46.

Alternatively, conventional 2-to-1 multiplexers can be interposed between the micro-register file 46 and the registers 54 in place of connecting the registers 48 directly to the bit lines of the micro-register file 46. The two inputs of the multiplexers are then coupled to the two buses associated with a given port of the register file. The output of the multiplexer is then coupled to the input of the register 54 corresponding to that port. For example, the buses 52A and 56A can be coupled to the inputs of a multiplexer and the output of the multiplexer can then be coupled to the register 54A. In this alternative scheme, the enable logic 55 would control the select line of the multiplexers and the registers 48 would not need to be tristatable.

The operation of the scalable register file according to the invention is as follows. Initially, instructions are stored in the first plurality of instruction registers 60. During a first pipeline stage, i.e., RA stage, the instructions stored in the instruction register 60 are decoded by instruction decoder 62. If the register fields of the instructions held in the instruction registers 60 specify a register within the micro-register file 44, the instruction decoder 62 will select that register and store the contents thereof in the pipeline register associated with the respective functional unit. In the next stage, i.e., RB stage, the instructions held in the first plurality of instruction register 60 are stored in the second plurality of instruction register 72. This transfer can occur either at the end of the first stage or at the beginning of the second stage.

During the second stage, the instructions held in the second plurality of instruction register 72 are decoded by the decoder 74. These are the same instructions that were decoded by the decoder 62 in the previous cycle. The decoder 74 will select the registers within the micro-register file 46, as specified by the register fields of the register 72. At the same time that the instruction decoder 74 is selecting the registers from the micro-register file 46, the enable logic 55 is selectively enabling those registers which had stored therein contents of the micro-register file 44 during the first cycle. Because the micro-register files 44 and 46 are mutually exclusive, there will not be any contention between the pipeline registers 48 and the micro-register file 46. The registers selected from the micro-register file 46 and the registers selectively enabled during the second pipeline cycle are then stored in the second plurality of pipeline registers 54 during the second pipeline cycle. The contents of the pipeline registers 54 are then available to their respective functional units for processing.

As should be apparent to those skilled in the art of computer design, the principles taught herein can be extended to any number of micro-register files, with a corresponding increase in the number of pipeline stages. The preferred embodiment of the invention described above included two micro-register filed. An exemplary pipeline for the preferred embodiment is as follows:

|IF|ID|RA|RB|EX|WB| where IF is an instruction fetch stage, ID is an instruction decode stage, RA is a first pipeline register stage, RB is a second pipeline register stage, EX is an execute stage, and WB is a write back stage. If more than two micro-register files are used, e.g., four micro-register files, the number of pipeline register stages would increase accordingly, e.g., RC, RD. Of course, there is a practical limit on the number of additional pipeline stages that can be added without adversely affecting the overall performance of the computer architecture.

It should also be apparent that the principles taught herein can be applied to superscalar architectures as well as VLIW architectures. There is essentially no difference to the register file whether the functional units are dependent, as in a superscalar architecture, or independent, as in a VLIW architecture. Moreover, although the invention has been described with reference to read ports, the invention can be applied equally as well to write ports. Also, all though in the preferred embodiment of the invention the micro-register files are of equal size, the invention is not limited to equal sized micro-register files.

Having described and illustrated the principles of the invention in a preferred embodiment thereof, it should be apparent that the invention can be modified in arrangement and detail without departing from such principles. We claim all modifications and variation coming within the spirit and scope of the following claims.

We claim:

1. A scalable register file for a computer architecture having multiple functional units, the register file comprising:

a first instruction register for holding an instruction;

a first micro-register file including a first plurality of registers and an output port;

a first instruction decoder coupled between the first micro-register file and the first instruction register for selecting one or more of the first plurality of registers during a first pipeline cycle;

a first pipeline register coupled to the output port of the first micro-register file for temporarily holding the contents of the first selected registers;

a second instruction register coupled to the first instruction register for receiving the instruction held in the first instruction register;

a second micro-register file including a second plurality of registers and an output port;

a second instruction decoder coupled between the second micro-register file and the second instruction register for selecting one or more of the second plurality of registers during a second pipeline cycle;

a second pipeline register coupled to the output port of the second micro-register file for temporarily holding the contents of the second selected registers, the second pipeline register being coupled to the first pipeline register to receive the first selected register contents during the second pipeline cycle; and enable logic to present the contents of the first pipeline register to the second pipeline register, during the second pipeline cycle, if there were contents stored in the first pipeline register during the first pipeline cycle.

2. A scalable register file according to claim 1 wherein the first micro-register file includes a plurality of output ports, each output port corresponding to a respective one of the functional units, the scalable register file further comprising:

a first plurality of instruction registers coupled to the first instruction decoder, each of the first plurality of instruction registers for holding an instruction corresponding to a respective functional unit; and a first plurality of pipeline registers, each of the first plurality of pipeline registers coupled to a respective output port of the first micro-register file.

3. A scalable register file according to claim 2 wherein the second micro-register file includes a plurality of output ports, each output port corresponding to a respective one of the functional units, the scalable register file further comprising:

a second plurality of instruction registers, each of the second plurality of instruction registers coupled to a respective one of the first plurality of instruction registers for receiving the instruction held therein; and a second plurality of pipeline registers, each of the second plurality of pipeline registers coupled to a respective output port of the second micro-register file;

each one of the first plurality of pipeline registers being coupled to a respective one of the second plurality of pipeline registers, and wherein the enable logic is coupled to each of the first pipeline registers to present the contents of the first plurality of pipeline registers to the respective one of the second plurality of pipeline registers, during the second pipeline cycle, if there were contents stored in the respective first plurality of pipeline registers during the first pipeline cycle.

4. A scalable register file according to claim 3 wherein the second micro-register file includes a plurality of bit lines and wherein the first plurality of pipeline registers are coupled to the bit lines of the second micro-register file.

5. A scalable register file according to claim 3 wherein the first micro-register file comprises a lower portion of the register file and the second micro-register file comprises an upper portion of the register file, the upper and lower portions being contiguous.

6. A scalable register file according to claim 5 wherein the first and second micro-register files each include an equal number of registers.

7. A scalable register file according to claim 5 wherein the first and second micro-register files each include 32 registers.

8. A microprocessor comprising:

a plurality of functional units; and a scalable register file having a plurality of read ports, each read port being coupled to a respective functional unit, the register file including at least first and second pipeline register stages;

the first and second pipeline register stages including:

a multiported micro-register file having a plurality of read ports, each port of the micro-register file corresponding to a respective functional unit;

a plurality of pipelined instruction registers for holding instructions, each instruction register corresponding to a respective functional unit, an instruction decoder coupled to the plurality of instruction registers for selecting registers required by each functional unit as specified by the instruction held in the corresponding instruction register;

a plurality of pipeline registers, each pipeline register coupled to a corresponding output port of the micro-register file to receive the contents of the selected registers, each instruction register of the first pipeline register stage being coupled to a corresponding instruction register of the second pipeline register stage, and each pipeline register of the first pipeline register stage being coupled to a corresponding pipeline register of the second pipeline register stage; and enable logic to present the contents of the pipeline registers of the first pipeline register stage to the corresponding pipeline register of the second pipeline register stage during a second pipeline cycle, if there were contents stored in the pipeline registers of the first pipeline register stage during a first pipeline cycle.

9. A microprocessor according to claim 8 wherein the functional units are independent functional units in a very long instruction word (VLIW) architecture.

10. A microprocessor according to claim 9 wherein the instructions held in the plurality of instruction registers comprise a very long instruction word.

11. A microprocessor according to claim 8 wherein the functional units are dependent functional units in a superscalar architecture.

12. A microprocessor according to claim 8 wherein the micro-register file of the second pipeline register stage includes a plurality of bit lines and wherein the pipeline registers of the first pipeline register stage are coupled to the bit lines of the micro-register file.

13. A microprocessor according to claim 8 wherein the pipeline registers of the first pipeline register stage are tristatable registers and wherein the enable logic enables the tristate drivers of the registers.

14. A method of minimizing access time of a register file for a computer architecture having a large number of registers or multiple functional units, the method comprising:

partitioning the register file into a first micro-register file having a first subset of the register file and a second micro-register file having a second subset of the register file, each register of the register file having contents stored therein;

selecting registers in the first micro-register file during a first pipeline cycle;

storing the contents of the registers which were selected during the first pipeline cycle;

selecting registers in the second micro-register file during a second pipeline cycle subsequent to the first pipeline cycle; and storing the contents of the registers which were selected during the second pipeline cycle and the stored contents of the registers selected during the first pipeline cycle.

15. A method of minimizing access time of a register file according to claim 14 wherein the step of partitioning the register file into a first micro-register file having a first subset of the register file and a second micro-register file having a second subset of the register file includes partitioning the register file into first and second micro-register files having equal sized subsets of the register file.

16. A method of minimizing access time of a register file according to claim 14 including driving the stored contents of the registers selected during the first pipeline cycle onto bit lines of the second micro-register file.

17. A method of minimizing access time of a register file according to claim 16 wherein the step of driving bit lines of the second micro-register file with the registers stored during the first pipeline cycle includes enabling a tristate driver.

18. A method of minimizing access time of a register file according to claim 14 wherein the step of selecting registers in the first micro-register file during a first pipeline cycle includes decoding an instruction held in an instruction register.

19. A method of minimizing access time of a register file according to claim 18 wherein the step of selecting registers in the second micro-register file during a second pipeline cycle subsequent to the first pipeline cycle includes:

providing the instruction held in the instruction register to a second instruction register;

storing the provided instruction in the second instruction register; and decoding the instruction stored in the second instruction register.

20. A method of minimizing access time of a register file according to claim 14 wherein the step of partitioning the register file into a first micro-register file having a first subset of the register file and a second micro-register file having a second subset of the register file includes partitioning the register file into a plurality of micro-register files, each micro-register file having a subset of the register file.

21. A pipelined register file for a computer architecture having multiple functional units, comprising:

a first stage including at least a first micro-register file including a first plurality of registers and a plurality of output ports, each of the output ports being associated with a respective one of the functional units, and a plurality of first pipeline registers, each of the first pipeline registers being coupled to a respective one of the output ports of the first micro-register file;

a second stage including at least a second micro-register file including a second plurality of registers and a plurality of output ports, each of the output ports being associated with a respective one of the functional units, and a plurality of second pipeline registers, each of the first pipeline registers being coupled to a respective one of the output ports of the second micro-register file; and means for selecting data for each of the functional units from one of the first micro-register file and the second micro-register file.

22. A pipelined register file according to claim 21 wherein said selecting means includes means for supply the selected data for each of the functional units to the respective functional units via the second pipeline registers, regardless of which of the micro-register files storing the selected data for a particular functional unit.

* * * * *